US012733543B2

(12) United States Patent
Beyer et al.

(10) Patent No.: US 12,733,543 B2
(45) Date of Patent: Sep. 8, 2026

(54) POWER SEMICONDUCTOR MODULE AND MANUFACTURING METHOD

(71) Applicant: Hitachi Energy Ltd, Zürich (CH)

(72) Inventors: Harald Beyer, Lenzburg (CH); Dominik Truessel, Bremgarten (CH); Milad Maleki, Untersiggenthal (CH); Fabian Fischer, Baden (CH); Robert Gade, Birr (CH)

(73) Assignee: Hitachi Energy Switzerland AG, Baden (CH)

( * ) Notice: Subject to any disclaimer, the term of this patent is extended or adjusted under 35 U.S.C. 154(b) by 702 days.

(21) Appl. No.: 18/020,817

(22) PCT Filed: Jul. 29, 2021

(86) PCT No.: PCT/EP2021/071322

§ 371 (c)(1),
(2) Date: Feb. 10, 2023

(87) PCT Pub. No.: WO2022/042998

PCT Pub. Date: Mar. 3, 2022

(65) Prior Publication Data

US 2023/0317684 A1 Oct. 5, 2023

(30) Foreign Application Priority Data

Aug. 27, 2020 (EP) .................................... 20193107

(51) Int. Cl.
*H10W 90/00* (2026.01)
*H10W 40/25* (2026.01)
(Continued)

(52) U.S. Cl.
CPC ......... *H10W 90/00* (2026.01); *H10W 40/255* (2026.01); *H10W 70/611* (2026.01);
(Continued)

(58) Field of Classification Search
None
See application file for complete search history.

(56) References Cited

U.S. PATENT DOCUMENTS 5,569,955 A * 10/1996 Chillara .............. H10W 70/479
257/E23.125
10,211,118 B2 * 2/2019 Kamata .............. H10W 40/255
(Continued)

FOREIGN PATENT DOCUMENTS

CN 203367241 U 12/2013
JP S63244747 A 10/1988
(Continued)

OTHER PUBLICATIONS

Petersson, B., et al., "Circuit-Board Mounting Using Double-Sided Adhesive Tape," GigaHertz 2003, Proceedings from the Seventh Symposium, Linköping Electronic Conference Proceedings 8:76, Nov. 6, 2003, 4 pages.

*Primary Examiner* — Dale E Page
*Assistant Examiner* — Rohit Parthasarathy
(74) *Attorney, Agent, or Firm* — Slater Matsil, LLP

(57) ABSTRACT

In one embodiment, a power semiconductor module includes a main substrate, semiconductor chips mounted on the main substrate, and an auxiliary substrate also mounted on the main substrate. The power semiconductor module is capable of handling a current of 10 A or more. The auxiliary substrate is a printed circuit board having at least one carrier layer that is based on an organic material. The auxiliary substrate provides a common contact platform for at least some of the first semiconductor chips. The auxiliary substrate is attached to the main substrate by a joining layer located at a bottom side of the at least one auxiliary substrate facing the main substrate. The joining layer is a continuous organic adhesive layer of an adhesive foil or a double-faced adhesive tape.

18 Claims, 6 Drawing Sheets

(51) Int. Cl.

| | |
|---|---|
| ***H10W 70/60*** | (2026.01) |
| ***H10W 70/65*** | (2026.01) |
| ***H10W 72/00*** | (2026.01) |
| ***H10W 72/30*** | (2026.01) |
| ***H10W 72/50*** | (2026.01) |

(52) U.S. Cl.

CPC ...... *H10W 70/65* (2026.01); *H10W 72/07355* (2026.01); *H10W 72/07554* (2026.01); *H10W 72/351* (2026.01); *H10W 72/547* (2026.01); *H10W 72/884* (2026.01); *H10W 90/731* (2026.01); *H10W 90/753* (2026.01)

(56) References Cited

U.S. PATENT DOCUMENTS

| | | | | |
|---|---|---|---|---|
| 10,418,307 | B2 * | 9/2019 | Schmit | H10W 40/255 |
| 10,692,806 | B2 * | 6/2020 | Jakobi | H10W 70/658 |
| 2004/0207070 | A1 * | 10/2004 | Kaufmann | H10W 42/60 257/E25.016 |
| 2015/0223320 | A1 * | 8/2015 | Gerhäußer | H05K 1/0207 29/832 |
| 2016/0005678 | A1 * | 1/2016 | Magni | H10W 70/467 257/676 |
| 2016/0056088 | A1 * | 2/2016 | Uhlemann | H10W 40/47 257/692 |
| 2016/0056132 | A1 * | 2/2016 | Bayerer | H10W 90/00 257/784 |
| 2017/0263527 | A1 * | 9/2017 | Mohn | H05K 1/115 |
| 2018/0005926 | A1 * | 1/2018 | Iwai | H10W 70/468 |
| 2018/0154887 | A1 * | 6/2018 | Murata | H02P 29/68 |
| 2018/0166549 | A1 * | 6/2018 | Kato | H10D 64/518 |
| 2020/0066686 | A1 * | 2/2020 | Mohn | H10W 90/00 |
| 2020/0258853 | A1 * | 8/2020 | Namba | H02M 1/088 |
| 2020/0335422 | A1 * | 10/2020 | Park | H10W 40/255 |
| 2020/0402880 | A1 * | 12/2020 | Yamauchi | H10W 74/121 |
| 2021/0351161 | A1 * | 11/2021 | Iguchi | H10W 76/47 |
| 2024/0079297 | A1 * | 3/2024 | Luniewski | H10W 70/421 |

FOREIGN PATENT DOCUMENTS

| | | | |
|---|---|---|---|
| JP | H02209787 | A | 8/1990 |
| JP | H06342986 | A | 12/1994 |
| JP | 2009194273 | A | 8/2009 |
| JP | 6324474 | B1 | 5/2018 |
| KR | 20070099263 | A | 10/2007 |

* cited by examiner

POWER SEMICONDUCTOR MODULE AND MANUFACTURING METHOD

CROSS-REFERENCE TO RELATED APPLICATIONS

This application is a national stage application of International Application No. PCT/EP2021/071322, filed on Jul. 29, 2021, which claims priority to European Patent Application No. 20193107.8, filed on Aug. 27, 2020, which applications are hereby incorporated herein by reference.

TECHNICAL FIELD

A power semiconductor module is provided. Further, a method for manufacturing such a power semiconductor module is also provided.

BACKGROUND

Document JP 2209787 A2 refers to a method for preparing a printed circuit board, where the printed circuit board is mounted to an aluminum block by means of a polyimide resin layer.

Document CN 203367241 U refers to a structure of a molded power package, where a printed circuit board is joined to a leadframe by wires or by a silver containing adhesive paste.

Document JP 6342986 A2 discloses a multilayer substrate with two circuit layers interconnected by vias or through holes, the circuit layers are mounted to a metal baseplate by means of an insulating coating and an adhesive agent.

Document US 2017/0263527 A1 refers to a semiconductor module that comprises a semiconductor device; a substrate, on which the semiconductor device is attached; a molded encasing, into which the semiconductor device and the substrate are molded; at least one power terminal partially molded into the encasing and protruding from the encasing, which power terminal is electrically connected with the semiconductor device; and an encased circuit board at least partially molded into the encasing and protruding over the substrate in an extension direction of the substrate, wherein the encased circuit board comprises at least one receptacle for a pin, the receptacle being electrically connected via the encased circuit board with a control input of the semiconductor device.

Document US 2016/0005678 A1 discloses an electronic device that includes a chip and a support element which supports the chip. Leads are provided to be electrically coupled to at least one terminal of the chip. A coupling element is mounted to a free region of the support element that is not occupied by the chip. The coupling element includes a conductive portion electrically connected to at least one lead and to the at least one terminal of the chip to obtain an electrical coupling.

Document US 2018/0005926 A1 describes a semiconductor device that includes a lead frame comprising a first terminal and a second terminal for grounding, a sealing resin which covers the lead frame, an exposed part which is a part of the second terminal and is exposed from the sealing resin and a conductive material which covers the surface of the sealing resin and contacts the second terminal at the exposed part.

Document JP S63 244747 A is drawn to a resin-sealed type integrated circuit device which comprises an island constituting a lead frame, and a plurality of hybrid units which, together with the island, are integrally sealed with a resin. The device has the advantages of simplicity of design and reduced size, but without any loss of quality.

SUMMARY

Embodiments provide a power semiconductor module that can efficiently be manufactured.

The power semiconductor module uses a printed circuit board, PCB for short, as an auxiliary substrate on a main substrate in order to provide a common contact platform for semiconductor chips. Using the PCB instead of, for example, a direct bonded copper substrate, DBC substrate for short, costs can be reduced and additional flexibility in circuitry can be gained.

In a first embodiment, the power semiconductor module comprises at least one main substrate (for example, a DBC substrate), a plurality of first semiconductor chips mounted on the main substrate, and at least one auxiliary substrate also mounted on the main substrate. The auxiliary substrate comprises a top face remote from the main substrate, wherein the auxiliary substrate is a printed circuit board comprising at least one carrier layer which is based on an organic material. The auxiliary substrate provides a common contact platform for the first semiconductor chips, and, for example, the first semiconductor chips are electrically connected to the auxiliary substrate by means of conductive means like bond wires, ribbons, foils, and/or clips.

BRIEF DESCRIPTION OF THE DRAWINGS

A power semiconductor module and a method described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

In the figures.

DETAILED DESCRIPTION OF ILLUSTRATIVE EMBODIMENTS

Figure 1:
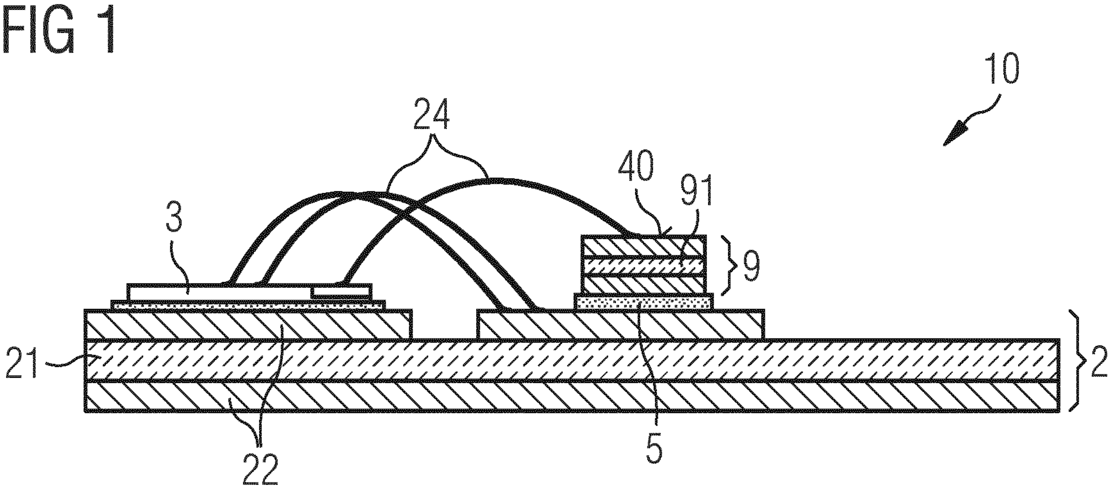
FIG. 1 is a schematic sectional view of a modification of a power semiconductor module.

Embodiments will be described followed by a discussion of the drawings.

In a first embodiment, a power semiconductor module (1) comprises at least one main substrate (2), a plurality of first semiconductor chips (3) mounted on the main substrate (2), and at least one auxiliary substrate (4) that is also mounted on the main substrate (2). The at least one auxiliary substrate (4) comprises a top face (40) remote from the main substrate (2. The power semiconductor module (1) is configured to handle a maximum current of at least 10 amperes. The at least one auxiliary substrate (4) is a printed circuit board comprising at least one carrier layer (41) which is based on an organic material and the at least one auxiliary substrate (4) provides a common contact platform (44) for at least some of the first semiconductor chips (3). Further, the at least one auxiliary substrate (4) is attached to the main substrate (2) by means of a joining layer (5) located at a bottom side (49) of the at least one auxiliary substrate (4) facing the main substrate (2). The joining layer (5) comprises a continuous organic adhesive layer (51) and the joining layer (51) is an adhesive foil or a double-faced adhesive tape.

The term 'power semiconductor module' means that the module is configured for high currents. Thus, the power semiconductor module is configured to handle a maximum current of at least 10 A or of at least 50 A or of at least 100 A or of at least 500 A. Correspondingly, the first semiconductor chips may be high-power components.

The, for example, fiber reinforced organic material for the carrier layer of the PCB is, for example, selected from the following group: polytetrafluoroethylene (PTFE), FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester). Hence, a cost efficient auxiliary substrate can be achieved.

The auxiliary substrate is attached to the main substrate by means of one joining layer or by means of a plurality of joining layers. The at least one joining layer is located at a bottom side of the auxiliary substrate facing the main substrate. The at least one joining layer is a continuous layer without any holes or recesses or cut outs. For example, the joining layer extends to at least 80% or 90% or completely between the auxiliary substrate and the main substrate. By means of such a joining layer, application of the auxiliary substrate to the main substrate can easily be made. As an alternative, the joining layer may have a structuring to achieve, for example, a plurality of electrical contacts or to improve adhesion to the main substrate.

The at least one joining layer comprises or consists of an organic adhesive layer. For example, the organic adhesive layer comprises or consists of at least one epoxy and/or of at least one polymer. By using organic adhesives, a temperature load to the main substrate when mounting the auxiliary substrate can be reduced.

According to at least one embodiment, the joining layer comprises or consists of at least one metallic layer. The at least one metallic layer may be realized by a solder layer and/or a sinter layer. There can be additional metallic layers adjoining the joining layer like diffusion barrier layers or like contact layers that improve adhesion between the joining layer and the auxiliary substrate or the main substrate, respectively. That is, the auxiliary substrate can include a backside metallization the joining layer is applied on. Using at least one metallic layer can provide a low thermal resistance between the auxiliary substrate and the main substrate.

According to at least one embodiment, the top face of the auxiliary substrate comprises or consists of a metal layer. For example, said metal layer is configured for wire bonding, for example, with wire bonds made of aluminum or copper. As an alternative to wire bonds, ribbons, foils or clips or the like can be used, too. The metal layer can be a continuous, flat layer. The metal layer can be the only component on the top face, except for the electrical connection means, that is, except for the wire bonds, ribbons, foils or clips or the like.

According to at least one embodiment, an electrical connection between the auxiliary substrate and the main substrate is also established by at least one electrical connection means like a bond wire, a ribbon, a foil or a clip, for example, by a plurality of electrical connection means. The at least one electrical connection means can run from the main substrate to the top face of the auxiliary substrate, or to electrical components mounted on the top face.

According to at least one embodiment, the first semiconductor chips are electrically contacted in parallel or anti-parallel. Thus, the auxiliary substrate can serve as the common contact platform for some or for all of the first semiconductor chips.

According to at least one embodiment, the power semiconductor module further comprises at least one second semiconductor chip. The second semiconductor chip or the second semiconductor chips is/are not, or at most indirectly, electrically connected to the auxiliary substrate.

According to at least one embodiment, the common contact platform is a gate contact for the first semiconductor chips. Thus, controlling the first semiconductor chips can be achieved by means of the auxiliary substrate. Hence, the auxiliary substrate is, for example, used for the interconnection of the gates of the respective first semiconductor chips, and not for a power circuit. In addition, the auxiliary substrate may also be used for other auxiliary connections like an auxiliary emitter, a collector contact, or a drain/source contact, or for interconnection of further electrical components like sensors.

According to at least one embodiment, the power semiconductor module comprises at least two of the auxiliary substrates. All the auxiliary substrates could be of the same fashion or there are differently constructed auxiliary substrates.

According to at least one embodiment, some of the first semiconductor chips are electrically connected with a first one of the auxiliary substrates, and some others of the first semiconductor chips are electrically connected with a second one of the auxiliary substrates. Hence, the first semiconductor chips are assigned to different contact platforms, for example, for different gate contacts.

According to at least one embodiment, the first semiconductor chips and/or the at least one second semiconductor chip is/are selected from the group comprising or consisting of a metal-oxide-semiconductor field-effect transistor (MOSFET), a metal-insulator-semiconductor field-effect transistor (MISFET), an insulated-gate bipolar transistor (IGBT), a bipolar junction transistor (BJT), a thyristor, a gate turn-off thyristor (GTO), a gate commutated thyristor (GCT), and a junction gate field-effect transistor (JFET). All the first and/or second semiconductor chips can be of the same type, or there are different kinds of first semiconductor chips and/or of second semiconductor chips.

According to at least one embodiment, the main substrate is a direct bonded copper substrate comprising a central ceramic layer and at least one metallization on each main side of the ceramic layer. As an alternative, the main substrate is an active metal brazed substrate, AMB substrate for short. Hence, the main substrate can efficiently be configured for high electrical loads.

According to at least one embodiment, the auxiliary substrate comprises a plurality of resistors. For example, each one of the resistors is assigned to up to two of the first semiconductor chips. For example, each one of the resistors is assigned to exactly one of the first semiconductor chips. For example, there are no resistors on the auxiliary substrate for the at least one second semiconductor chip.

According to at least one embodiment, the resistors are electric devices mounted on the top face of the auxiliary substrate. Thus, the resistors can be applied to the top face by means of, for example, soldering or sintering, or may also be connected by an electrically conductive adhesive.

According to at least one embodiment, the resistors are structures formed in the top face or in an interior of the auxiliary substrate. That is, the resistors and the auxiliary substrate are fashioned as one piece. For example, the resistors are realized as thin conductor tracks or as constrictions in conductor tracks. Such conductor tracks may be shaped in a meandering manner.

According to at least one embodiment, the power semiconductor module comprises at least three or at least four of the first semiconductor chips for which the auxiliary substrate provides the common contact platform. Optionally, there are at least eight or at least ten first semiconductor chips. Alternatively or additionally, the number of first semiconductor chips is at most 50 or at most 30 or at most 15. Concerning these numbers, the same can apply to the second semiconductor chips.

According to at least one embodiment, the top face of the auxiliary substrate comprises conductor tracks. Each one of these conductor tracks is, for example, assigned to up to two or to up to four of the first semiconductor chips. For example, there is a one-to-one assignment between these conductor tracks and the first semiconductor chips so that separate conductor tracks can be assigned to the respective individual first semiconductor chips.

According to at least one embodiment, at least some or all of the conductor tracks have the same length irrespective of the start and end positions of the conductor tracks. Hence, it can be avoided that by the auxiliary substrate itself electrical path length differences are introduced.

According to at least one embodiment, the conductor tracks assigned to the first semiconductor chips have different lengths on the auxiliary substrate. By having different lengths, otherwise existing length differences of electrical connection lines in the power semiconductor module to the first semiconductor chips and running over the auxiliary substrate can be compensated for.

According to at least one embodiment, at least some conductor tracks of the auxiliary substrate run in parallel or anti-parallel at least in sections. Hence, parallel or antiparallel signal paths can be established so that electromagnetic coupling can be reduced.

According to at least one embodiment, seen in top view of the top face, the first semiconductor chips are arranged along two sides of the auxiliary substrate so that the auxiliary substrate is located between the first semiconductor chips. The auxiliary substrate may be a line of symmetry concerning the arrangement of the first semiconductor chips. Electrical contact points for the first semiconductor chips on the top face could also be arranged in a symmetric manner. If there is a plurality of the auxiliary substrates, this can apply for one of for more than one of the auxiliary substrates.

According to at least one embodiment, the auxiliary substrate is a multi-layer substrate. That is, there are at least two electrically conductive layers like metallic layers. For example, there is at least one interior conductive layer distant from the top face and/or there is at least one conductive layer a bottom side of the auxiliary substrate. For example, there is one conductive layer at the top face, one conductive layer at the bottom side and one or more than one intermediate, interior conductive layers.

According to at least one embodiment, at least two or all of the conductor tracks of the auxiliary substrate are formed as partly flipping traces. By such an arrangement, electromagnetic coupling could be reduced. Thus, the respective conductor tracks are not limited to the top face, but are located in different levels above the main substrate.

According to at least one embodiment, the at least one interior conductive layer is configured as an electrical shielding layer. Thus, electric components at the top face can be protected to at least some extent from electromagnetic fields resulting from the large currents on the main substrate. The interior conductive layer or at least one of the interior conductive layers may also be structured to form additional conductor tracks.

For example, only the main substrate, and not the auxiliary substrate, is configured for large currents. For example, the auxiliary substrate is configured for a maximum current of 5 A or less, or of 2 A or less, or of 1 A or less.

According to at least one embodiment, the auxiliary substrate is provided with at least two different kinds of electric devices. Such electric devices are, for example, at least one of resistors or integrated circuits (ICs) or sensors like negative temperature coefficient thermistors (NTCs) or also positive temperature coefficient thermistors (PTCs).

The power semiconductor module is, for example, a power module in a vehicle to convert direct current from a battery to alternating current for an electric motor, for example, in hybrid vehicles or plug-in electric vehicles.

A method for manufacturing the power semiconductor module is additionally provided. By means of the method, a power semiconductor module is produced as indicated in connection with at least one of the above-stated embodiments. Features of the power semiconductor module are therefore also disclosed for the method and vice versa.

The method is for manufacturing the power semiconductor module and comprises: A) providing the main substrate, and B) mounting the auxiliary substrate onto the main substrate. The auxiliary substrate comprises a pre-applied primary material layer that forms the joining layer in method step B).

That is, in method step B) the at least one pre-applied primary material layer becomes the at least one joining layer. If there is a plurality of pre-applied primary material layers, all these layers may become one joining layer. In method step B), the primary material layer may undergo a chemical reaction or a drying step, or may alternatively remain unchanged or essentially unchanged concerning its material composition and/or its shape.

Prior to step B), as an alternative, the primary material layer can be a homogeneous layer or may have a pattern to achieve, for example, an improved attachment process and/or adhesion to the main substrate.

According to at least one embodiment, prior to method step B) the main substrate is free of any primary material layer or joining layer configured for mounting the auxiliary substrate. Thus, at the subsequent location of the auxiliary substrate, prior to method step B) at the main substrate there is, for example, only an empty, blank surface portion, for example, of the metallization at the main substrate.

According to at least one embodiment, the primary material layer is a glue coated onto the bottom side of the auxiliary substrate prior to method step B). When mounting the auxiliary substrate to the main substrate, the glue may be pre-cured or may have a thin solidified skin to prevent contamination of the main substrate with glue at undesired locations.

According to a first implementation, the primary material layer is an adhesive foil applied on the bottom side of the auxiliary substrate. Hence, the primary material layer can be a solid or essentially solid component.

According to a second implementation, the primary material layer is a double-faced adhesive tape applied on the bottom side of the auxiliary substrate. For example, the primary material layer comprises, prior to method step B), a peel-off coating on a side remote from the top face. Thus, a long life span of the primary material layer prior to method step B) can be realized.

FIG. 1 illustrate a modified power semiconductor module 10. The module 10 comprises a main substrate 2 and a further substrate 9. Both substrates 2, 9 are DBC substrates. The further substrate 9 is connected to the main substrate 2 by means of a joining layer 5 which may be a solder layer.

The main substrate 2 comprises a central ceramic layer 21, corresponding to the ceramic layer 91 of the further substrate 9. There are metallizations 22 on both sides of the central ceramic layers 21, 91. An electrical connection between a top face 40 of the further substrate 9 and first semiconductor chips 3 on the main substrate 2 is achieved by means of bond wires 24. Because FIG. 1 is a sectional view, only one of the plurality of the first semiconductor chips 3 can be seen.

In power semiconductor modules, the operation of the switching devices, that is, of the first semiconductor chips 3, is controlled by gate signals. Therefore, the gate contacts of all switching devices must be interconnected with the external gate terminal of the power module. Each switching device should have its own interconnection of the gate provided by the further substrate 9. Additionally, the delay of gate signals due to electromagnetic coupling should be homogeneous for all first semiconductor chips 3 to provide simultaneous switching.

The interconnection of the gates of all first semiconductor chips 3, that is, the bond wire connections, consumes much space of the main substrate 2 to provide a metallization pattern for the gate or control circuit, for example, in power modules, where many first semiconductor chips 3 are mounted on the main substrate 2 like it is in power modules with wide bandgap devices. Even more important, the two-layer design having the substrates 2, 9 allows for fast and clear switching, when the further substrate 9 is mounted on top of the circuit pattern of source or emitter/source in case of a power MOSFET or an IGBT, respectively.

In addition, this demand of space enhances the size of the substrate resulting in an increase of the costs of the substrate and, consequently, of the power module. For example, a power module may contain up to 20 SiC Power MOSFET devices as the first semiconductor chips 3, which consequently need in sum 20 gate interconnections.

These further substrates 9 are typically DBC substrates (DBC: direct bonded copper) comprising or consisting of the electrically insulating ceramic layer 21 and the metallizations 22 on the top side and on the back side. The further substrate 9 is joined to the main substrate 2 by gluing, sintering, or soldering. Consequently, an additional joining process is needed to attach the further substrate 9 to the main substrate 2. Gate resistors can also be mounted on the further substrate 9, not shown in FIG. 1.

However, the use of DBC based further substrates 9, which are joined to the metallization pattern of the main substrate 2, has some disadvantages:

DBC substrates based on an electrically insulating ceramic sheet are causing high costs. So even a small DBC substrate based on comparably cheap aluminum oxide ceramic has a price of about 1 CHF. Moreover, manufacturing of small DCBs is challenging on supplier side and typically is associated with a low yield.

A DBC substrate in the low-cost region has no structures in the metallization pattern. Then, only a homogenous single layer metallization for a control circuit is available. So no specific layout of the control circuit for an improvement of the electromagnetic behavior is possible, for example, because preparation of individual small-size conductor traces is not possible on DBC substrates.

A separate joining process of gluing, soldering, or sintering with thermal impact is needed to join the further substrate 9 to the main substrate 2.

There is a need of investment for gluing machines and tools.

A contamination of the regions of the power circuit metallization of the main substrate 2 neighbored to the joining connection of the further substrate 9 during the joining process cannot be excluded. This may result in a poor process capability of wirebond connections or in the demand of safety spaces for proper processing.

Thus, the use of DBC based further substrates 9, which are mounted to the main substrate 2 by gluing, soldering or sintering, has some disadvantages. Overcoming theses disadvantages can be achieved by using an auxiliary substrate 4 made by printed circuit board (PCB) technology, which will provide a cheap and reliable technology for low voltage circuitry.

Figure 2:
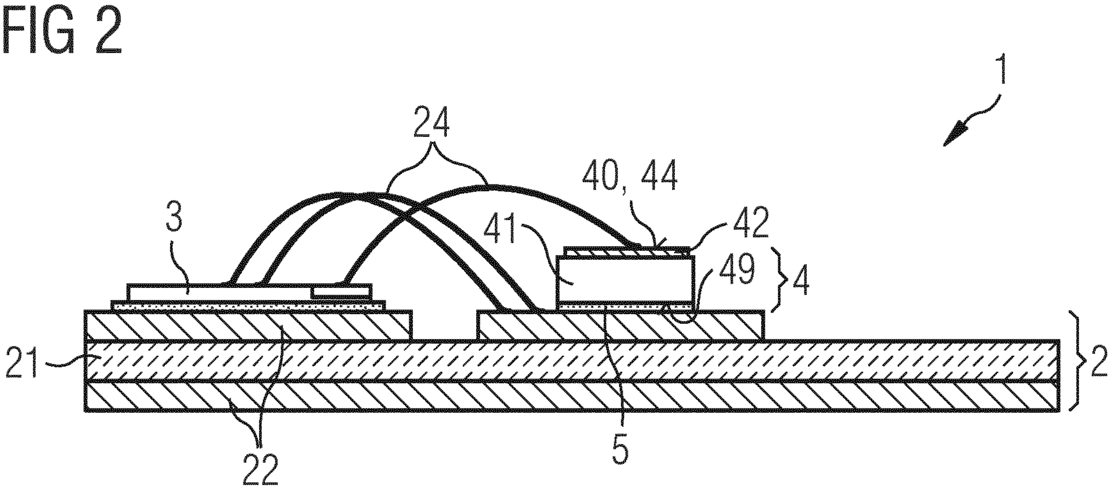
FIG. 2 is a schematic sectional view of an exemplary embodiment of a power semiconductor module described herein.

In the present power semiconductor module 1, the further substrate 9 of FIG. 1 made of direct bonded copper is replaced by an auxiliary substrate 4 made of a small printed circuit board to provide the interconnections of gate contacts of the first semiconductor chips 3, see FIG. 2.

In a simple case, the printed circuit board has only a metal layer 42 on a top face 40 and an optional bottom metallization metal layer at a bottom side 49, but for an improvement of control circuitry, for example, with respect to electromagnetic behavior, the use of a multi-layered PCB is also possible. The realization of wirebond connections, by thick aluminum or copper bond wires 24, is possible similar to DBC substrates. Optionally, gate resistors can be mounted on the top face 40 of the printed circuit board, not shown in FIG. 2.

For attachment, a joining layer 5 made of an adhesive foil can directly be applied on the bottom side 49 of the printed circuit board on supplier side. Hence, the auxiliary substrate 4 can be directly attached to the metallization pattern of the main substrate 2 by a simple pick & place process without strong thermal impact. Consequently, the impact of contaminations on the surroundings of the joining layer 5 due to the joining process is reduced. Auxiliary substrates 4 based on printed circuit board technology can be used for all types of power modules like gel filled power modules or molded power modules and technologies like Si IGBTs or wide bandgap devices.

The realization of auxiliary substrates 4 based on printed circuit board technology instead of a DBC substrate provides some business benefits, for example:

- The material price of a printed circuit board is much lower than for a DBC substrate. PCB based auxiliary substrates 4 have a price of about 0.05 CHF/piece, whereas the price of corresponding DBC substrates is around 1.00 CHF/piece.
- A reduction of manufacturing costs is also provided. The use of a PCB auxiliary substrate 4 with pre-applied adhesive needs only a simple pick & place process. On the one hand, the manufacturing time and the number of process steps for joining of the auxiliary substrate 4 to the main substrate 2 is reduced. On the other hand, a further cost-down is achieved due to no need of additional joining materials.
- Due to reduced contaminations of surrounding areas, the process capability of subsequent wirebond processes is improved accompanied by reduced yield losses.
- The use of a printed circuit board leads to the opportunity of an improvement of the electromagnetic behavior of auxiliary circuitry on the auxiliary substrate 4 resulting in improved and more homogeneous switching behavior of the first semiconductor chips 3 and consequently in better module performance and lifetime. Actually, the electromagnetic behavior of the complete circuitry can be improved by having the auxiliary substrate 4.

Nevertheless, it should be considered that the positive effects of auxiliary substrates 4 based on PCB technology are more significant for power semiconductor modules 1 where a large number of first semiconductor chips 3 is mounted on the main substrate 2, as it is the situation in wide-bandgap products like in the automotive branch, where, for example, up to 20 SiC MOSFETs are mounted to the main substrate 2 that may have lateral dimensions of about 60×60 $mm^2$.

When using a printed circuit board as the auxiliary substrate 4, also sintering or soldering are possible for joining the auxiliary substrate 4 to the main substrate 2. Here, solder material or sinter material is, for example, pre-applied to the bottom side 49. The joining process can then be done by a thermally assisted pick & place process. Possible alternatives to wirebonding for interconnections on the auxiliary substrates 4, as used in FIG. 2, are ribbons, foils or clips, for example. Additionally or alternatively, auxiliary terminals can be directly joined to the top face 40 of the auxiliary substrate 4. The same is true for all other exemplary embodiments.

Figure 3:
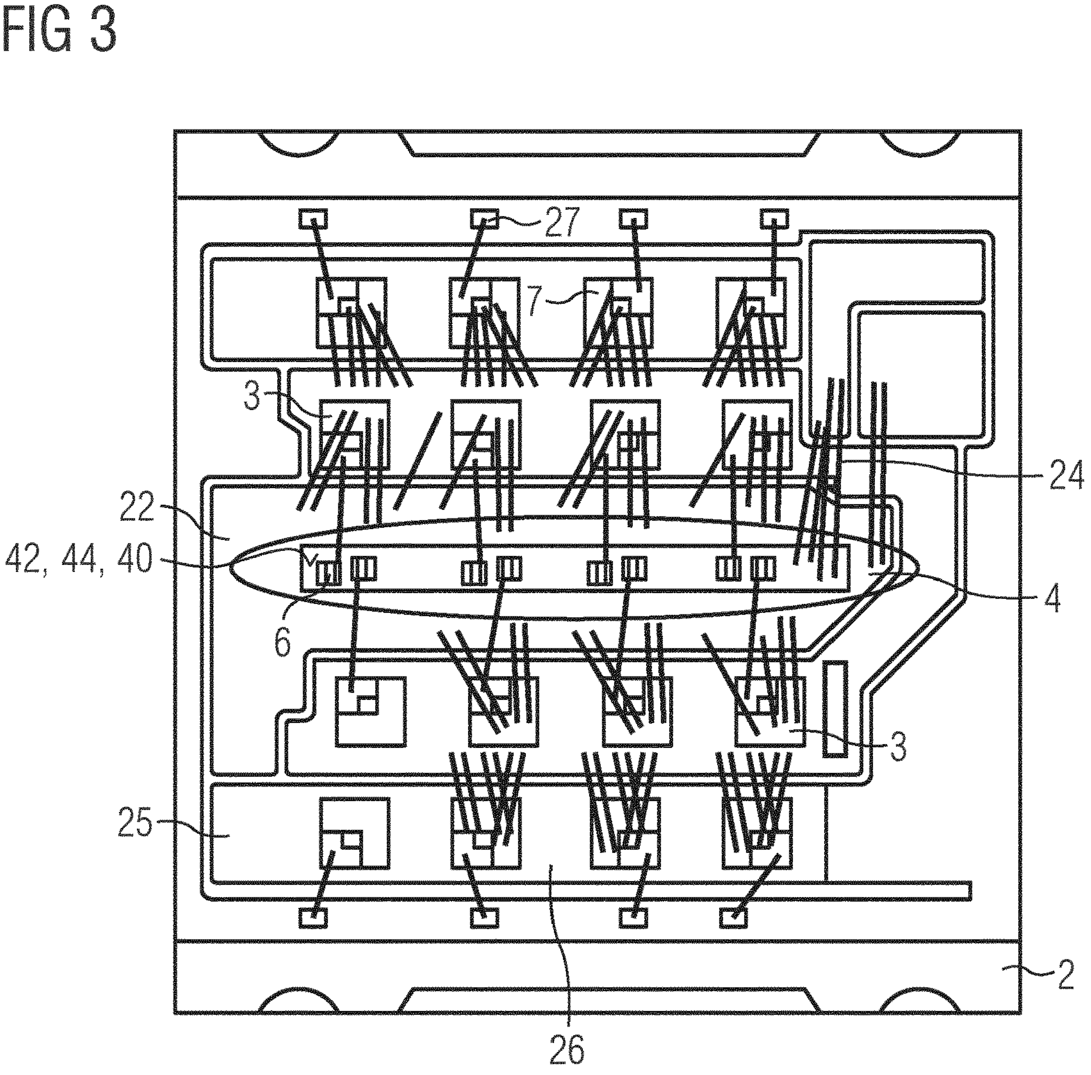
FIG. 3 is a schematic top view of an exemplary embodiment of a power semiconductor module described herein.

FIG. 3 illustrates a power semiconductor module 1 comprising 16 power MOSFFET devices, that is, eight first semiconductor chips 3 and eight second semiconductor chips 7, for example. The first and second semiconductor chips 3, 7 may be of the same type. The first semiconductor chips 3 are arranged in two lines next to the auxiliary substrate 4 where the latter is a line of symmetry regarding the semiconductor chips 3, 7, seen in top view. Only the first semiconductor chips 3 are electrically connected to the auxiliary substrate 4 by means of the bond wires 24. Instead of the bond wires 24, other electrical connection means like ribbons, foils, or clamps can be used, too. The same is true for all other exemplary embodiments.

The PCB-based auxiliary substrate 4 can be mounted on a conductor path 26 formed in the metallization 22 of the main substrate 2. The first semiconductor chips 3 are electrically directly connected both to said metallization 22 and to the top face 40 of the auxiliary substrate 4. However, there is no direct electric connection between said metallization 22 and the top face 40. That is, there are two different and separate circuitries, one on the auxiliary substrate 4 and one on the main substrate 2.

Moreover, there are additional bond wires 24 to at least one other conductor path 26 of the main substrate 2 to the top face 40 so that the top face 40 can serve as a common gate contact for all the first semiconductor chips 3. Thus, first electrical connection means run directly from the main substrate 2 to the auxiliary substrate 4, for example, from an auxiliary pattern of the main substrate 2 to the auxiliary substrate 4 that is distant from the first and second semiconductor chips 3, 7, while other, second electrical connection means run directly from the first semiconductor chips 3 to the auxiliary substrate 4. The same may apply to all other exemplary embodiments.

On the top face 40, there are resistors 6. The resistors 6 have direct electric contact to the metal layer 42 and also to the first semiconductor chips 3 by means of the bond wires 24. For example, each first semiconductor chip 3 is contacted to its own resistor 6. To compensate for different electrical path lengths, the resistors 6 can have slightly different resistances, for example, in the range from 1Ω to 10Ω. The same can apply to all other exemplary embodiments. The second semiconductor chips 7 are, for example, electrically connected to additional electric devices 27 which can also be resistors; thus, the same as for the resistors 6 applies for the additional electric devices 27.

Figure 4:
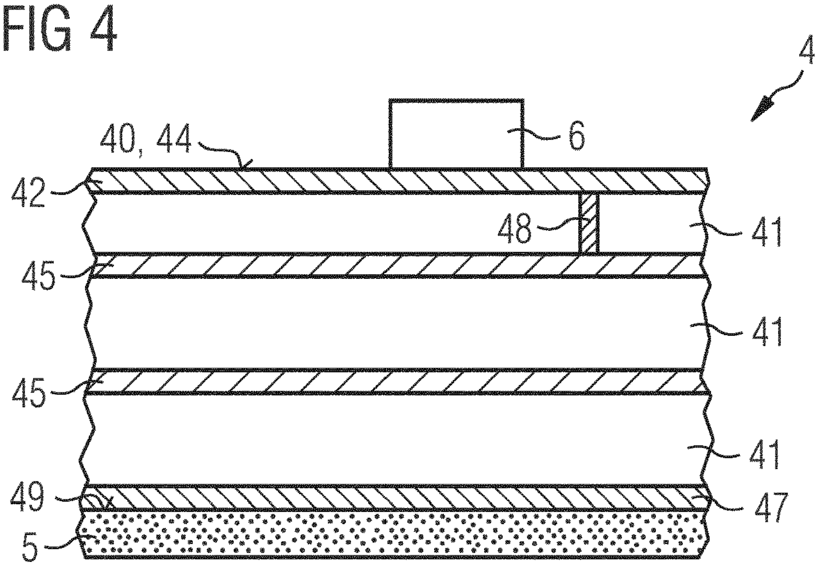
FIG. 4 is a schematic sectional view of an auxiliary substrate for exemplary embodiments of a power semiconductor module described herein.

In FIG. 4, an exemplary embodiment of the auxiliary substrate 4 is illustrated in more detail. Said auxiliary substrate 4 can be used in all exemplary embodiments. The auxiliary substrate 4 is of multi-layered fashion and comprises, in addition to the metal layer 42 at the top face 40, interior conductive layers 45. It is possible that there are vias 48 to interconnect the layers 42, 45. However, for example, there is at least one interior conductive layer 45 not connected to the top face 40. Such a layer 45 may provide some shielding against electromagnetic fields, and to reduce parasitic inductance between a gate signal on the auxiliary substrate 4 and emitter/source currents on the main substrate 2.

Further, as an option, there is the bottom metallization layer 49. This layer 49 may completely or essentially completely be covered by the joining layer 5.

Like in all other exemplary embodiments, individually or together, the following may apply: A thickness of the auxiliary substrate 4 is, for example, at least 0.2 mm and at most 3 mm. Alternatively or additionally, lateral dimensions of the auxiliary substrate 4, seen in top view of the top face 40, may be at least 1 mm×20 mm and/or at most 15 mm×150 mm. Moreover, a thickness of the metal layers 42, 45, 49 is, for example, at least 20 μm or 80 μm and/or at most 0.3 mm or 0.1 mm. Contrary to that, a thickness of the metallizations 22 of the main substrate 2 is, for example, at least 0.1 mm and/or at most 1 mm. A thickness of the joining layer 5 is, for example, at least 10 μm or 30 μm and/or at most 0.3 mm or 0.1 mm.

In FIGS. 5 to 8, the focus is on the electrical circuitry at the top face 40 of the auxiliary substrate 4. These aspects can apply to all other exemplary embodiments, individually or collectively. The aspects not mentioned in FIGS. 5 to 8 may be realized like in the other exemplary embodiments.

Figure 5:
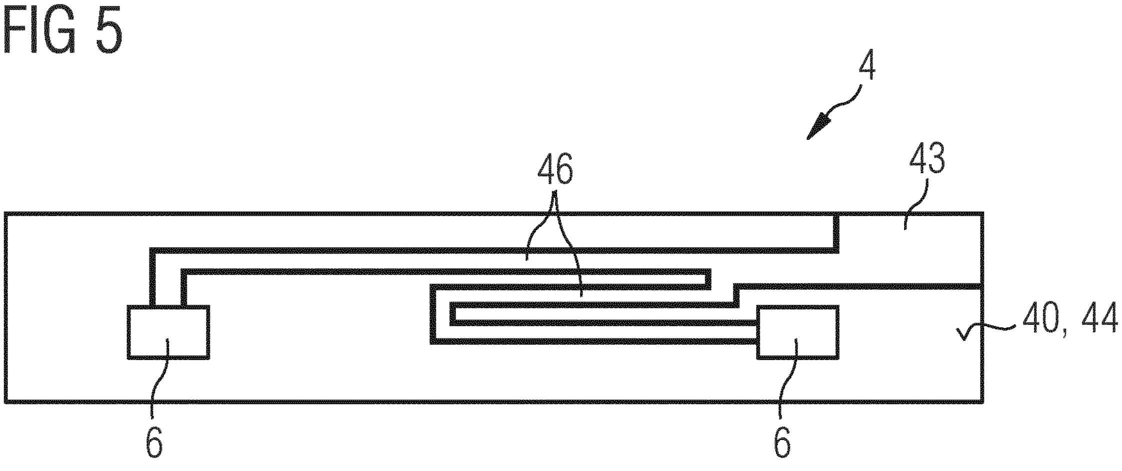
FIGS. 5 to 7 are schematic top views of auxiliary substrates for exemplary embodiments of a power semiconductor module described herein.

According to FIG. 5, the metal layer at the top face 40 is shaped into conductor tracks 46. At least some of the conductor tracks 46 have the same length to avoid electrical path length differences due to the auxiliary substrate 4. Thus, a contact area 43 for a bond wire or the like may be located at an end of the top face 40, but all electrical devices like the resistors 6 are connected with the same electrical path lengths. That is, when using several conductive traces 46, the length of the signal paths related to each first semiconductor chip 3 can be individually adjusted to achieve an improved homogeneity in switching of all electrically parallel devices.

Moreover, parasitic inductance of the electrical paths of gate signals can be reduced by a trace layout providing parallel or antiparallel signal paths, compare FIG. 5, too.

In FIG. 5, the resistors 6 are realized by separate devices mounted on the top face 40. Contrary to that, see FIG. 6, the resistors 6 can be prepared by a corresponding layout of the conductive traces. This facilitates the replacement of the gate resistors accompanied by a corresponding cost saving. Additionally, resistors prepared by trace layout give the option to realize gate resistors having an optimum resistance for each chip facilitating higher homogeneity in switching.

Figure 6:
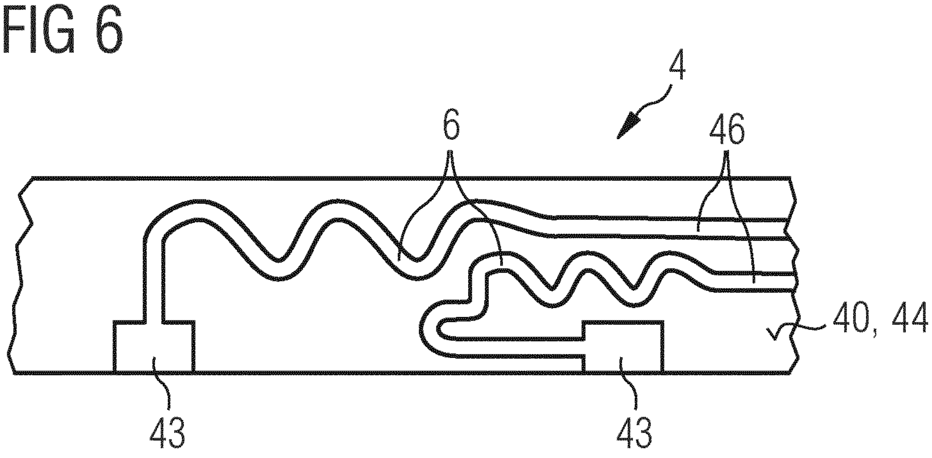

There can be individual contact areas 43 for the resistors 6, see FIG. 6, or there can be just one common contact area 43 for all the resistors 6, as illustrated in FIG. 5. Both variants can in principle be applied to all the exemplary embodiments.

Figure 7:
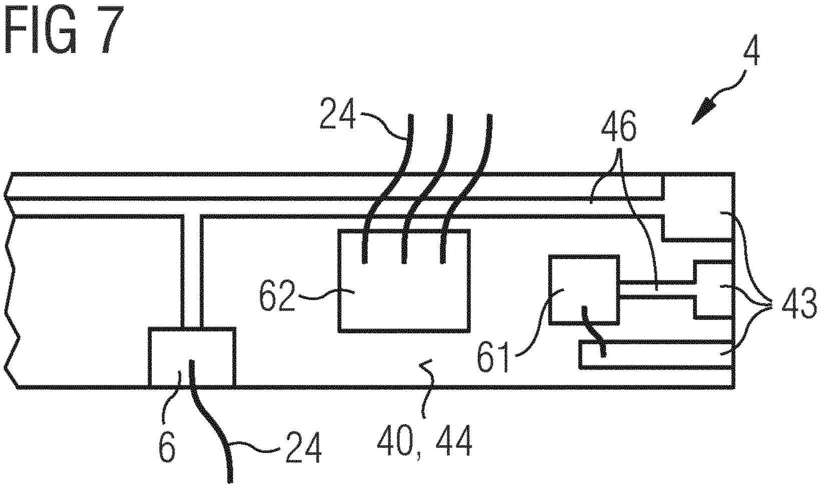

According to FIG. 7, there is at least one sensor chip as a second type 61 of electric devices, beside the resistors 6 as a first kind of electric device. As an option, there can be a further type 62 of electric devices, like ICs. It is possible that the devices 6, 61, 62 are directly electrically connected to the top face 40 by means of contact areas 43 and/or the devices 6, 61, 62 are connected by means of bond wires 24.

Hence, the use of a printed circuit board with traces facilitates the integration of further functionalities like auxiliary emitter/source and auxiliary collector or electrical paths for the interconnection of integrated sensors like thermistors. Additionally, traces may be used for multiple signal paths in the case of an intelligent power semiconductor module 1.

In all FIGS. 5 to 7, electrical interconnections between the auxiliary substrate 4 and the main substrate 2 may alternatively or additionally be provided by ribbons, foils, or clips instead of the bond wires.

Figure 8:
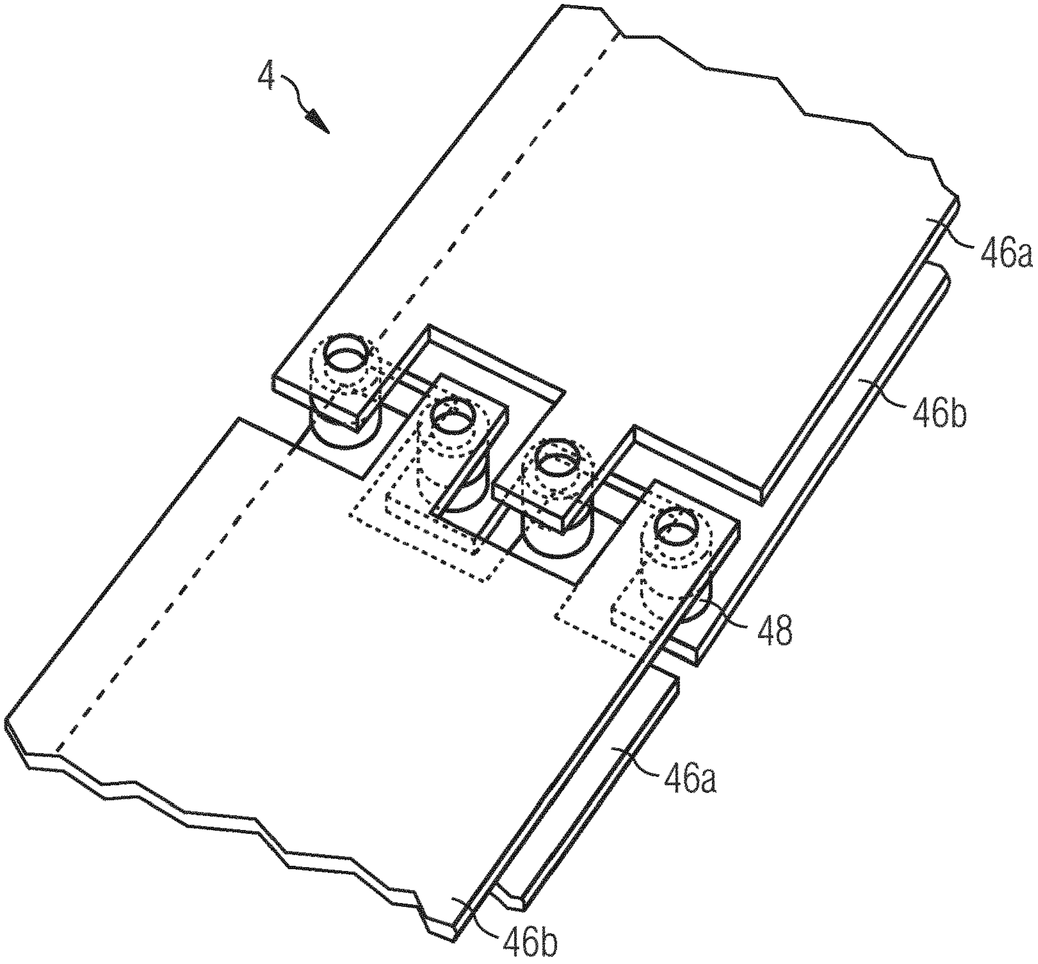
FIG. 8 is a schematic perspective view of an auxiliary substrate for exemplary embodiments of a power semiconductor module described herein.

In the case of a multi-layered PCB for the auxiliary substrate 4, compare FIG. 8, an improved coupling of gate and auxiliary emitter/source can be realized by partly flipping gate and emitter/source traces, for example. Thus, conductor tracks 46*a*, 46*b* can both run at two different levels in/at the auxiliary substrate 4 and different portions of the respective conductor track 46*a*, 46*b* can be connected by means of vias 48. In FIG. 8, only two pairs of conductor tracks 46*a*, 46*b* is illustrated, but of course there can be more conductor tracks, for example, as illustrated in FIGS. 5 to 7.

Figure 9:
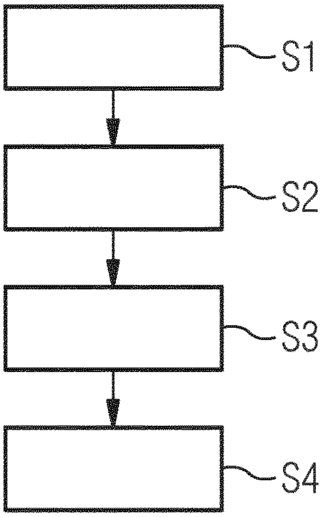
FIG. 9 is a schematic block diagram of an exemplary embodiment of a method for manufacturing power semiconductor module described herein.

FIG. 9 illustrates a block diagram of a method to manufacture the power semiconductor modules 1. In method step S1, the main substrate 2 is provided.

In optional method step S2, the first and/or second semiconductor chips 3, 7 are mounted on the main substrate 2.

According to method step S3, the auxiliary substrate 4 is attached to the main substrate 2. The joining of the auxiliary substrate 4 to the main substrate 2 is, for example, done by a pick & place process, which is optionally thermally and/or pressure assisted.

Finally, in method step S4 the wiring is finished.

In FIGS. 10 to 14, some possibilities of mounting the auxiliary substrate 4 to the main substrate 2 are illustrated. These figures show the situation prior to method step S3, that is, prior to mounting the auxiliary substrate 4.

According to FIG. 10, there is a primary material layer 50 that later forms the joining layer 5 when the auxiliary substrate 4 is provided on the main substrate 2. In the exemplary embodiment of FIG. 10, the primary material layer 50 is a layer of an organic adhesive 51. The organic adhesive 51 is, for example, a solid. The primary material layer 50 can cover the complete or essentially the complete bottom side 49. For example, the primary material layer 50 is of plane parallel fashion. When applying the auxiliary substrate 4 to the main substrate 2, not shown in FIG. 10, the primary material layer 50 is, for example, pressed onto the main substrate 2 so that the primary material layer 50 then constitutes the joining layer 5.

Figure 11:
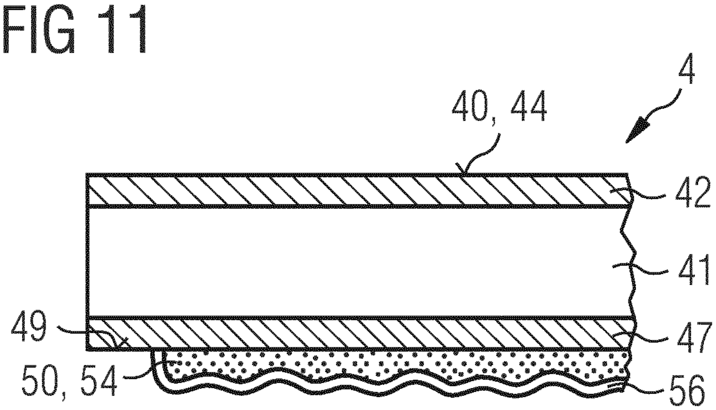

In FIG. 11, the primary material layer 50 is a glue 54 applied to the auxiliary substrate 4. The glue 54 is of constant or approximately constant thickness, for example, of 0.1 mm. The glue 54 is, for example, in a viscous state. As an option, to avoid contaminations of the glue 54 to the main substrate 2, there can be a thin skin 56 of already dried glue 54. This skin 56 is destroyed when pressing the auxiliary substrate 4 to the main substrate 2. Moreover, the glue 54 may cover the bottom side 49 only in part so that there is an edge region free of the glue 54. As an option, there is the bottom metallization layer 47.

Figure 10:
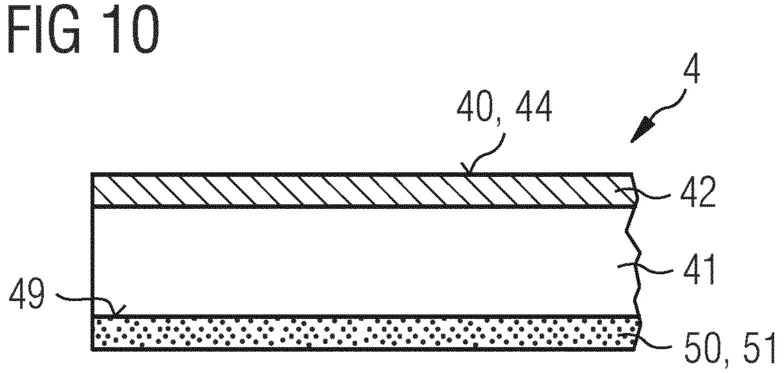
FIGS. 10 to 14 are schematic side views of auxiliary substrates for exemplary embodiments of a power semiconductor module described herein.

Like in FIG. 10, the primary material layer 50 may be thermally cured or is cured by drying after application to the main substrate 2, or does not need a particular curing step at all.

Figure 12:
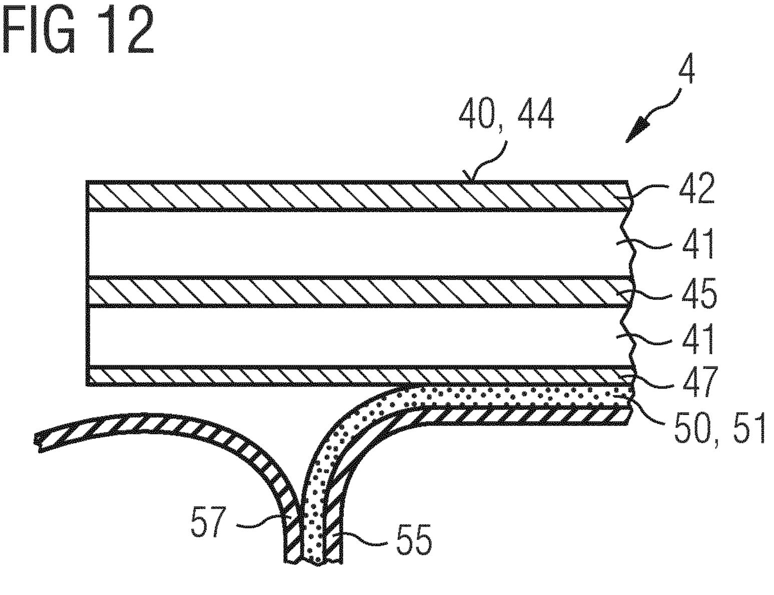

According to FIG. 12, the primary material layer 50 comprises the adhesive 51 and two peel-off coatings 55, 57. Thus, the primary material layer 50 is a double-faced adhesive tape. The inner peel-off coating 57 facing the auxiliary substrate 4 is peeled off upon mounting the adhesive 51 onto the auxiliary substrate 4, while the outer peel-off coating 57 is removed later just when the auxiliary substrate 4 is mounted onto the main substrate 2. When the primary material layer 50 is applied on the auxiliary substrate 4 and only the peel-off coating 55 remote from the top face 40 is present, the auxiliary substrate 4 may be stored for some time prior to being mounted onto the main substrate 2.

Figure 13:
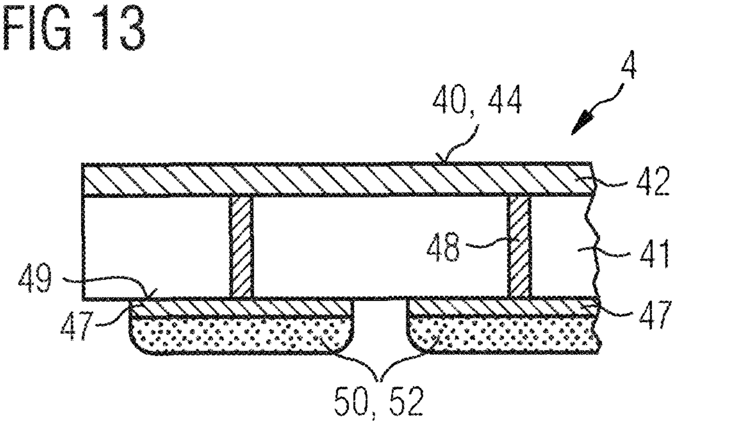

In FIG. 13 it is illustrated that the primary material layer 50 is a pre-applied solder layer 52.

As an option, there can be individual contact areas at the bottom side 49 so that the bottom metallization layer 47 can be fashioned in a structured manner. Moreover, there can be vias 48 towards the top face 40. Hence, wire bonding may be omitted. If the adhesive 51 or the glue 54 in FIGS. 10 to 12 is electrically conductive, for example, if electrically conductive particles are included in an organic matrix material, such a structured bottom metallization layer 47 can also be used in these exemplary embodiments.

Figure 14:
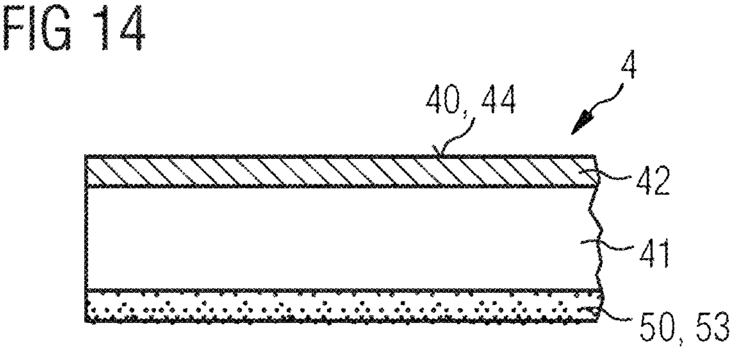

According to FIG. 14, the primary material layer 50 is a pre-applied sinter layer 53. That is, when heated, the sinter layer 53 connects with the main substrate 2 and forms the joining layer 5, for example, using pressure and/or elevated temperature. For the rest, the same as to FIG. 13 applies to FIG. 14.

Figure 15:
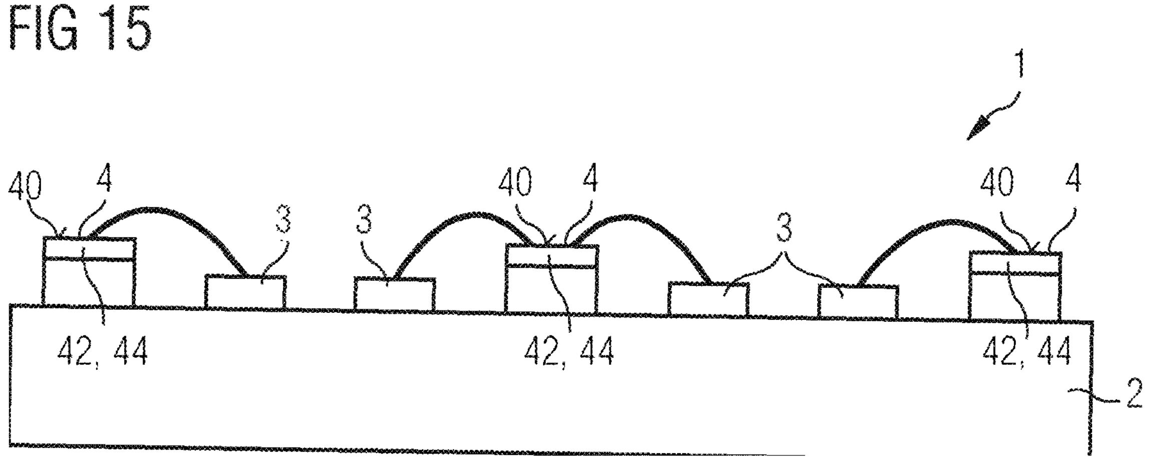
FIG. 15 is a schematic sectional view of an exemplary embodiment of a power semiconductor module described herein.

In FIG. 15, another exemplary embodiment of the power semiconductor module 1 is illustrated. In this case, there is more than one auxiliary substrate 4, for example, three auxiliary substrates 4. Hence, compared with FIG. 3, the second semiconductor chips 7 of FIG. 3 have become first semiconductor chips 3 in FIG. 15 by adding the two outermost additional auxiliary substrates 4. All the auxiliary substrates 4 can be of the same design, although different numbers of first semiconductor chips 3 may be assigned to the auxiliary substrates 4. The same applies to all other exemplary embodiments.

Moreover, in FIG. 15 is shown that the top face 40 is in each case formed by the respective metal layer 42 only. The metal layers 42 can be of continuous, plane fashion, but as an alternative can also be structured to comprise contact areas and/or conductor tracks like in FIGS. 5 to 8. Thus, there are no resistors or other electric devices on the top faces 40, contrary to what is illustrated in FIG. 3, for example. The same applies to all other exemplary embodiments.

Otherwise, the same as to FIG. 3 also applies to FIG. 15.

LIST OF REFERENCE SIGNS

| | |
|---|---|
| 1 | power semiconductor module |
| 2 | main substrate |
| 21 | ceramic layer |
| 22 | metallization |
| 24 | bond wire |
| 25 | terminal |
| 26 | contact surface/conductor path |
| 27 | additional electric device |
| 3 | first semiconductor chip |
| 4 | auxiliary substrate |
| 40 | top face |
| 41 | carrier layer based on an organic material |
| 42 | metal layer |
| 43 | contact area |
| 44 | common contact platform |
| 45 | interior conductive layer |
| 46, 46a, 46b | conductor track |
| 47 | bottom metallization layer |
| 48 | via |
| 49 | bottom side |
| 5 | joining layer |
| 50 | primary material layer |
| 51 | organic adhesive |
| 52 | solder layer |
| 53 | sinter layer |
| 54 | glue |
| 55 | outer peel-off coating |
| 56 | skin |
| 57 | inner peel-off coating |
| 6 | resistor, first kind of electric device |
| 61 | sensor chip, second type of electric device |
| 62 | IC, further type of electric device |
| 7 | second semiconductor chip |
| 9 | further substrate |
| 91 | ceramic layer |
| 10 | modified power semiconductor module |
| S.. | method step |

The invention claimed is:

1. A power semiconductor module comprising:

a main substrate;

a plurality of first semiconductor chips mounted on the main substrate;

a first auxiliary substrate mounted on the main substrate, the first auxiliary substrate comprising a top face remote from the main substrate; and a second auxiliary substrate mounted on the main substrate, the second auxiliary substrate comprising a top face remote from the main substrate;

wherein the power semiconductor module is capable of handling a current of 10 A or more;

wherein the first auxiliary substrate is a printed circuit board comprising at least one carrier layer that is based on an organic material;

wherein the first auxiliary substrate provides a common contact platform for first ones of the first semiconductor chips;

wherein the second auxiliary substrate provides a common contact platform for second ones of the first semiconductor chips; and wherein the first auxiliary substrate is attached to the main substrate by a joining layer located at a bottom side of the first auxiliary substrate facing the main substrate, the joining layer comprising a continuous organic adhesive layer, wherein the joining layer is an adhesive foil or a double-faced adhesive tape;

wherein the first auxiliary substrate is a multi-layer substrate; and wherein the first auxiliary substrate comprises an interior conductive layer that is configured as an electrical shielding layer to reduce electromagnetic coupling.

2. The power semiconductor module according to claim 1, wherein the organic material comprises a fiber reinforced organic material selected from the group consisting of polytetrafluoroethylene (PTFE), FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), and CEM-5 (woven glass and polyester).

3. The power semiconductor module according to claim 1, wherein each common contact platform is a gate contact for the respective first semiconductor chips.

4. The power semiconductor module according to claim 1, wherein the top face of the first auxiliary substrate comprises a metal layer so that there is a direct electrical connection between the metal layer and the main substrate, and wherein the first ones of the first semiconductor chips are electrically directly contacted to the metal layer, wherein the first ones of the first semiconductor chips are electrically connected in parallel.

5. The power semiconductor module according to claim 1, further comprising second semiconductor chips mounted on the main substrate, wherein the second semiconductor chips are electrically separated from the first auxiliary substrate and the second auxiliary substrate.

6. The power semiconductor module according to claim 1, wherein the first semiconductor chips comprise chips selected from the group consisting of MOSFETs, MISFETs, IGBTs, BJTs, thyristors, GTOs, GCTs, and JFETs.

7. The power semiconductor module according to claim 1, wherein the main substrate is a direct bonded copper substrate comprising a central ceramic layer and at least one metallization on each main side of the ceramic layer.

8. The power semiconductor module according to claim 1, wherein the first ones of the first semiconductor chips comprise at least three first semiconductor chips for which the first auxiliary substrate provides the common contact platform;

wherein the top face of the first auxiliary substrate comprises conductor tracks, each one of the conductor tracks is assigned to up to two of the first ones of the first semiconductor chips; and wherein the conductor tracks have different lengths so that otherwise existing length differences of electrical connection lines in the power semiconductor module to the first ones of the first semiconductor chips running over the first auxiliary substrate are compensated for.

9. The power semiconductor module according to claim 1, wherein conductor tracks of the first auxiliary substrate run electrically in parallel or anti-parallel in sections; and wherein, seen in top view of the top face, the first ones of the first semiconductor chips are arranged along two sides of the first auxiliary substrate, so that the first auxiliary substrate is located between the first ones of the first semiconductor chips.

10. A power semiconductor module comprising:

a main substrate;

an auxiliary substrate mounted on the main substrate, wherein the auxiliary substrate is a printed circuit board comprising a carrier layer based on an organic material and wherein the auxiliary substrate comprises a plurality of resistors;

a joining layer located at a bottom side of the auxiliary substrate to attach the auxiliary substrate to the main substrate, the joining layer comprising a continuous organic adhesive layer, wherein the joining layer is an adhesive foil or a double-faced adhesive tape;

a plurality of first power semiconductor chips mounted directly on the main substrate and electrically connected to the auxiliary substrate, each of the resistors being assigned to up to two of the first semiconductor chips, wherein the power semiconductor module is capable of handling a current of 10 A or more;

wherein the plurality of first semiconductor chips comprises at least three first semiconductor chips for which the auxiliary substrate provides a common contact platform;

wherein a top face of the auxiliary substrate comprises conductor tracks, each one of the conductor tracks is assigned to up to two of the first semiconductor chips; and wherein the conductor tracks have different lengths.

11. The power semiconductor module according to claim 1, wherein the first auxiliary substrate comprises a plurality of resistors, each of the resistors being assigned to up to two of the first ones of the first semiconductor chips.

12. The power semiconductor module according to claim 11, wherein the resistors comprise discrete devices mounted on the top face of the first auxiliary substrate.

13. The power semiconductor module according to claim 11, wherein the resistors are structures formed in the top face or in an interior of the first auxiliary substrate.

14. The power semiconductor module according to claim 1, wherein the first auxiliary substrate is provided with at least two different types of electric devices or semiconductor chips.

15. The power semiconductor module of claim 10, further comprising a plurality of second power semiconductor chips mounted on the main substrate, the second power semiconductor chips not being electrically connected to the auxiliary substrate.

16. The power semiconductor module according to claim 15, further comprising a second auxiliary substrate that provides a common contact platform for the second power semiconductor chips, the common contact platform being a gate contact.

17. A method for manufacturing a power semiconductor module, the method comprising:

providing a main substrate;

mounting an auxiliary substrate onto the main substrate, the auxiliary substrate comprising a printed circuit board having a carrier layer that is based on an organic material, the auxiliary substrate being mounted using a joining layer located at a bottom side of the auxiliary substrate facing the main substrate to attach the auxiliary substrate to the main substrate, the joining layer comprising a continuous organic adhesive layer, wherein the joining layer is an adhesive foil or a double-faced adhesive tape; and mounting a plurality of first semiconductor chips over the main substrate, wherein the auxiliary substrate provides a common contact platform for at least some of the first semiconductor chips;

wherein the power semiconductor module is capable of handling a current of 10 A or more; and wherein the auxiliary substrate comprises a pre-applied primary material layer that forms the joining layer, wherein prior to mounting the auxiliary substrate the main substrate is free of any primary material layer or joining layer configured for mounting the auxiliary substrate.

18. The method according to claim 17, wherein the primary material layer is the adhesive foil so that the primary material layer is a solid component or the double-faced adhesive tape, which comprises a peel-off coating before mounting.

* * * * *